US012205957B2

(12) United States Patent
Wu et al.

(10) Patent No.: US 12,205,957 B2
(45) Date of Patent: Jan. 21, 2025

(54) DISPLAY SUBSTRATE, MANUFACTURING METHOD THEREOF, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Xinguo Wu, Beijing (CN); Fengguo Wang, Beijing (CN); Hong Liu, Beijing (CN); Yu Feng, Beijing (CN); Liang Tian, Beijing (CN); Haidong Wang, Beijing (CN); Shicheng Song, Beijing (CN)

(73) Assignees: Ordos Yuansheng Optoelectronics Co., Ltd., Inner Magnolia (CN); BOE Technology Group Co., Ltd., Beijing (CN)

(*) Notice: Subject to any disclaimer, the term of this patent is extended or adjusted under 35 U.S.C. 154(b) by 187 days.

(21) Appl. No.: 17/626,765

(22) PCT Filed: Mar. 10, 2021

(86) PCT No.: PCT/CN2021/079855
§ 371 (c)(1),
(2) Date: Jan. 12, 2022

(87) PCT Pub. No.: WO2021/196999
PCT Pub. Date: Oct. 7, 2021

(65) Prior Publication Data
US 2023/0018774 A1    Jan. 19, 2023

(30) Foreign Application Priority Data
Apr. 3, 2020 (CN) .......................... 202010259736.6

(51) Int. Cl.
*H01L 27/12* (2006.01)

(52) U.S. Cl.
CPC ........ *H01L 27/1222* (2013.01); *H01L 27/124* (2013.01); *H01L 27/127* (2013.01)

(58) Field of Classification Search
CPC . H01L 27/1222; H01L 27/124; H01L 27/127; H01L 27/1225; H01L 29/78618
See application file for complete search history.

(56) References Cited

U.S. PATENT DOCUMENTS 8,890,156 B2 * 11/2014 Yeh .................... H01L 27/1222
257/59
10,651,205 B2 * 5/2020 Cao .................... G02F 1/136286
(Continued)

FOREIGN PATENT DOCUMENTS

| CN | 103353683 A | 10/2013 |
| CN | 104600030 A | 5/2015 |

(Continued)

OTHER PUBLICATIONS

PCT/CN2021/079855 international search report and written opinion.

*Primary Examiner* — Allison Bernstein
(74) *Attorney, Agent, or Firm* — IPro, PLLC

(57) ABSTRACT

The present disclosure provides a display substrate, a manufacturing method thereof, and a display device. The display substrate includes a base substrate and a plurality of pixels arranged on the base substrate, each pixel includes a plurality of sub-pixels, and each sub-pixel includes a first active layer, a first gate insulation layer, a gate electrode, a second gate insulation layer, a second active layer, a first insulation layer, a source electrode and a drain electrode laminated one on another. The source electrode is connected with the first active layer through a via hole penetrating through the first insulation layer, the second gate insulation layer and the first gate insulation layer, and the source electrode and the drain (Continued)

electrode are connected with the second active layer through a via hole penetrating through the first insulation layer.

19 Claims, 8 Drawing Sheets

(56) References Cited

U.S. PATENT DOCUMENTS

| | | | |
|---|---|---|---|
| 2009/0014799 A1* | 1/2009 | Isobe | ............ H01L 27/0688 |
| | | | 257/351 |
| 2018/0374874 A1 | 12/2018 | Cao et al. | |
| 2019/0326382 A1 | 10/2019 | Park et al. | |

FOREIGN PATENT DOCUMENTS

| CN | 108400139 A | 8/2018 |
|---|---|---|
| CN | 111341793 A | 6/2020 |

* cited by examiner

DISPLAY SUBSTRATE, MANUFACTURING METHOD THEREOF, AND DISPLAY DEVICE

CROSS-REFERENCE TO RELATED APPLICATION

This application is the U.S. national phase of PCT Application No. PCT/CN2021/079855 filed on Mar. 10, 2021, which claims a priority of the Chinese patent application No. 202010259736.6 filed on Apr. 3, 2020, which is incorporated herein by reference in its entirety.

TECHNICAL FIELD

The present disclosure relates to the field of display technology, in particularly to a display substrate, a manufacturing method thereof, and a display device.

BACKGROUND

At present, Augmented Reality (AR)/Virtual Reality (VR) display devices develop rapidly, and there is a dramatically increasing need to develop display panels to which the display devices are applied. The AR/VR display devices are mostly 1000 Pixels Per Inch (PPI) (pixel density) products, with a pixel size of about 10 μm (microns), and most of the AR/VR display devices are provided with thin film transistors (TFTs) with a double gate structure. However, with an increasing market demand for AR/VR, there is a strong demand for display panels with higher PPI (such as 1500+ PPI), so as to achieve delicate picture quality, eliminate graininess and dizziness. Due to a pixel size of one 1500+ PPI display panel being limited to 5 μm-6 μm, it is difficult to use the TFTs with the double gate structure in original design. As a result, a TFT with a single gate structure is used, resulting in large leakage current, gray-scale bright spots, Flicker, and other defects.

SUMMARY

An object of the present disclosure is to provide a display substrate, a manufacturing method thereof, and a display device.

The present disclosure is implemented as follows:

In one aspect, the present disclosure provides in some embodiments a display substrate, including a base substrate and a plurality of pixels arranged on the base substrate, each pixel including a plurality of sub-pixels, and each sub-pixel including a first active layer, a first gate insulation layer, a gate electrode, a second gate insulation layer, a second active layer, a first insulation layer, a source electrode and a drain electrode laminated one on another. The source electrode is connected with the first active layer through a via hole penetrating through the first insulation layer, the second gate insulation layer and the first gate insulation layer; and the source electrode and the drain electrode are connected with the second active layer through a via hole penetrating through the first insulation layer.

In a possible embodiment of the present disclosure, an orthographic projection of the second active layer onto the base substrate is arranged within a region of an orthographic projection of the first active layer onto the base substrate.

In a possible embodiment of the present disclosure, the display substrate further includes a data line and a second insulation layer. The data line is arranged at a side of the base substrate close to the first active layer, the second insulation layer is arranged between the data line and the first active layer, and the first active layer is connected with the data line through a via hole penetrating through the second insulation layer.

In a possible embodiment of the present disclosure, an orthographic projection of the first active layer onto the base substrate and an orthographic projection of the second active layer onto the base substrate are arranged within a region of an orthographic projection of the data line onto the base substrate.

In a possible embodiment of the present disclosure, the display substrate further includes a third insulation layer, a pixel electrode, a fourth insulation layer and a common electrode. The pixel electrode is connected with the drain electrode through a via hole penetrating through the third insulation layer, and the fourth insulation layer is arranged between the pixel electrode and the common electrode.

In a possible embodiment of the present disclosure, a pixel density of the display substrate is greater than or equal to 1500 PPI.

In another aspect, the present disclosure provides in some embodiments a display device, including the above-mentioned display substrate.

In a possible embodiment of the present disclosure, the display device is an AR display device or a VR display device.

In yet another aspect, the present disclosure provides in some embodiments a manufacturing method of the display substrate, including providing a substrate; and forming a first active layer, a first gate insulation layer, a gate electrode, a second gate insulation layer, a second active layer, a first insulation layer, a source electrode and a drain electrode on the base substrate in sequence. The source electrode is connected with the first active layer through a via hole penetrating through the first insulation layer, the second gate insulation layer and the first gate insulation layer; and the source electrode and the drain electrode are connected with the second active layer through a via hole penetrating through the first insulation layer.

In a possible embodiment of the present disclosure, an orthographic projection of the second active layer onto the base substrate is arranged within a region of an orthographic projection of the first active layer onto the base substrate.

In a possible embodiment of the present disclosure, prior to forming the first active layer on the base substrate, the manufacturing method further includes: forming a data line on the base substrate; and forming a second insulation layer on the data line and forming a via hole in the second insulation layer. The first active layer is connected with the data line through a via hole penetrating through the second insulation layer.

In a possible embodiment of the present disclosure, after forming the source electrode and the drain electrode on the base substrate, the manufacturing method further includes: forming a third insulation layer and forming a via hole in the third insulation layer; forming a pixel electrode connected with the drain electrode through a via hole penetrating through the third insulation layer; forming a fourth insulation layer; and forming a common electrode.

According to the embodiments of the present disclosure, the active layers with upper and lower laminated structures are provided, and the gate electrode and the gate insulation layer are arranged between the laminated active layers, so as to implement a TFT with the same effect as a TFT with the double gate structure. Without changing the pixel size and an aperture ratio, it is able to effectively reduce leakage current of the TFT and improve gray scale bright spots, flicker and other related defects, thereby to improve customer experience.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
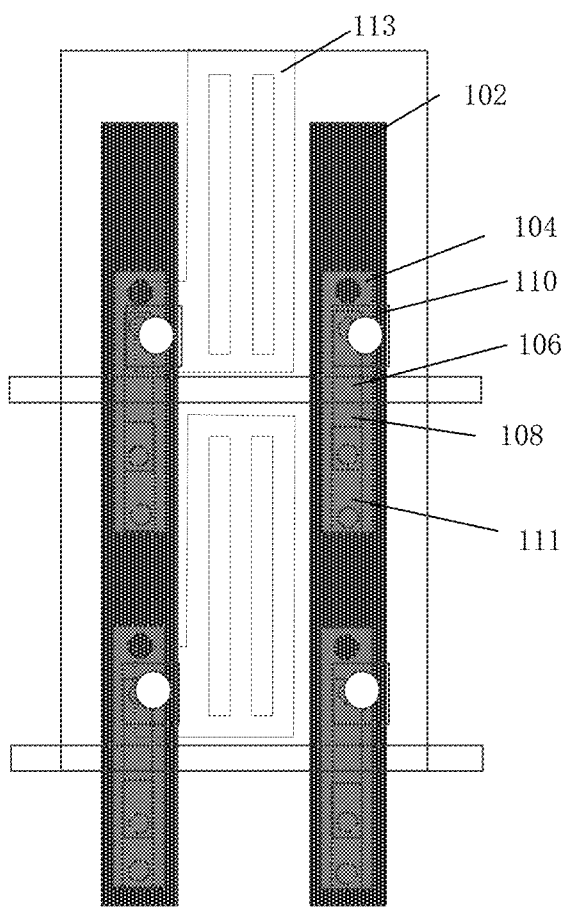
FIG. 1 is a plan view of a display substrate according to one embodiment of the present disclosure.
Figure 2:
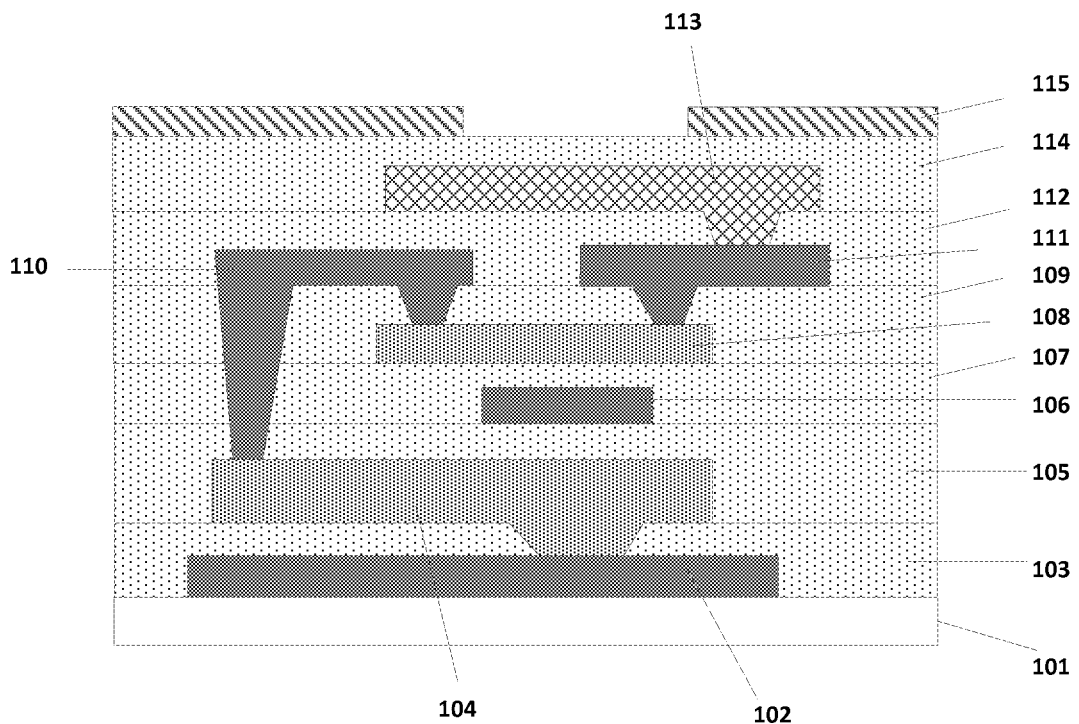
FIG. 2 is a sectional view of the display substrate according to one embodiment of the present disclosure.

In order to solve the problem of using the TFT with the single gate structure in the high-PPI display device, which results in large leakage current, gray-scale bright spots, flicker, and other defects, as shown in FIG. 1 and FIG. 2, the present disclosure provides in some embodiments a display substrate, which includes a base substrate 101 and a plurality of pixels arranged on the base substrate 101, each pixel including a plurality of sub-pixels, and each sub-pixel including a first active layer 104, a first gate insulation layer 105, a gate electrode 106, a second gate insulation layer 107, a second active layer 108, a first insulation layer 109, a source electrode 110 and a drain electrode 111 laminated one on another. The source electrode 110 is connected with the first active layer 104 through a via hole penetrating through the first insulation layer 109, the second gate insulation layer 107 and the first gate insulation layer 105; and the source electrode 110 and the drain electrode 111 are connected with the second active layer 108 through a via hole penetrating through the first insulation layer 109.

According to the embodiments of the present disclosure, the active layers with upper and lower laminated structures are provided, and the gate electrode and the gate insulation layer are arranged between the laminated active layers, so as to implement a TFT with the same effect as a TFT with the double gate structure. Without changing the pixel size and an aperture ratio, it is able to effectively reduce leakage current of the TFT and improve gray scale bright spots, flicker and other related defects, thereby to improve customer experience.

In a possible embodiment of the present disclosure, the base substrate 101 is a glass substrate or a substrate made of other materials.

In the embodiments of the present disclosure, the first active layer 104 is used to form a first switch of the TFT with the same effect as the TFT with the double gate structure. The first active layer 104 is made of a poly (polycrystalline silicon) material or other semiconductor materials, such as indium gallium zinc oxide (IGZO).

In a possible embodiment of the present disclosure, the first gate insulation layer 105 and the second gate insulation layer 107 are made of the same insulation material or different materials.

In the embodiments of the present disclosure, the gate electrode 106 is used to control the conduction of the TFT, and the gate electrode 106 is made of a metal material.

In the embodiments of the present disclosure, the second active layer 108 is used to form a second switch of the TFT with the same effect as the TFT with the double gate structure. The second active layer 108 is made of a poly or other semiconductor materials, such as IGZO, and the materials of the second active layer 108 and the first active layer 104 may be the same or different.

In the embodiments of the present disclosure, the first insulation layer 109 is an interlayer insulation layer for separating the source electrode, the drain electrode and the second active layer 108, and for forming a via hole.

In the embodiments of the present disclosure, the source electrode 110 and the drain electrode 111 are made of a metal material, and the source electrode 110 and the drain electrode 111 are made of the same or different metal materials as the gate electrode 106.

In a possible embodiment of the present disclosure, as shown in FIG. 2, an orthographic projection of the second active layer 108 onto the base substrate 101 is arranged within a region of an orthographic projection of the first active layer 104 onto the base substrate 101, so as to further improve the aperture ratio of the pixel.

In a possible embodiment of the present disclosure, as shown in FIG. 1 and FIG. 2, the display substrate further includes a data line 102 and a second insulation layer 103. The data line 102 is arranged at a side of the base substrate 101 close to the first active layer 104, the second insulation layer 103 is arranged between the data line 102 and the first active layer 104, and the first active layer 104 is connected with the data line 102 through a via hole penetrating through the second insulation layer 103. The data line 102 is used to transmit data signals to the TFT, and also used to isolate metal ions in the base substrate 101.

In a possible embodiment of the present disclosure, an orthographic projection of the first active layer 104 onto the base substrate 101 and an orthographic projection of the second active layer 108 onto the base substrate 101 are arranged within a region of an orthographic projection of the data line 102 onto the base substrate, that is, the data line 102 may be reused as a light shielding layer for the first active layer 104 and the second active layer 108, so as to prevent the first active layer 104 and the second active layer 108 from being illuminated by the backlight, thereby to improve performance of the TFT.

Of course, in some other embodiments of the present disclosure, the data line 102 may be arranged on the same layer and made of the same material as the source electrode 110 and the drain electrode 111, so as to form the data line 102, the source electrode 110 and the drain electrode 111 through a single patterning process, so as to save the quantity of masks.

In a possible embodiment of the present disclosure, the display substrate further includes a third insulation layer 112, a pixel electrode 113, a fourth insulation layer 114 and a common electrode 115. The pixel electrode 113 is connected with the drain electrode 111 through a via hole penetrating through the third insulation layer 112, and the fourth insulation layer 114 is arranged between the pixel electrode 113 and the common electrode 115.

In a possible embodiment of the present disclosure, the third insulation layer 112 may be a planarization layer for isolating the source electrode 110 and the drain electrode 111.

In a possible embodiment of the present disclosure, the fourth insulation layer 114 may be a passivation (PVX) layer.

In the embodiments of the present disclosure, the pixel electrode 113 and the common electrode 115 are used to form a pixel driving electric field, and strip-shaped hollows are formed in the common electrode 115. The pixel electrode 113 and the common electrode 115 may be made of the same transparent conductive material, such as indium tin oxide (ITO).

In a possible embodiment of the present disclosure, a pixel density of the display substrate is greater than or equal to 1500 PPI, which may be used to form the high-PPI display device.

The present disclosure further provides in some embodiments a display device, including the above-mentioned display substrate.

In a possible embodiment of the present disclosure, the display device is an AR display device or a VR display device.

Figure 3:
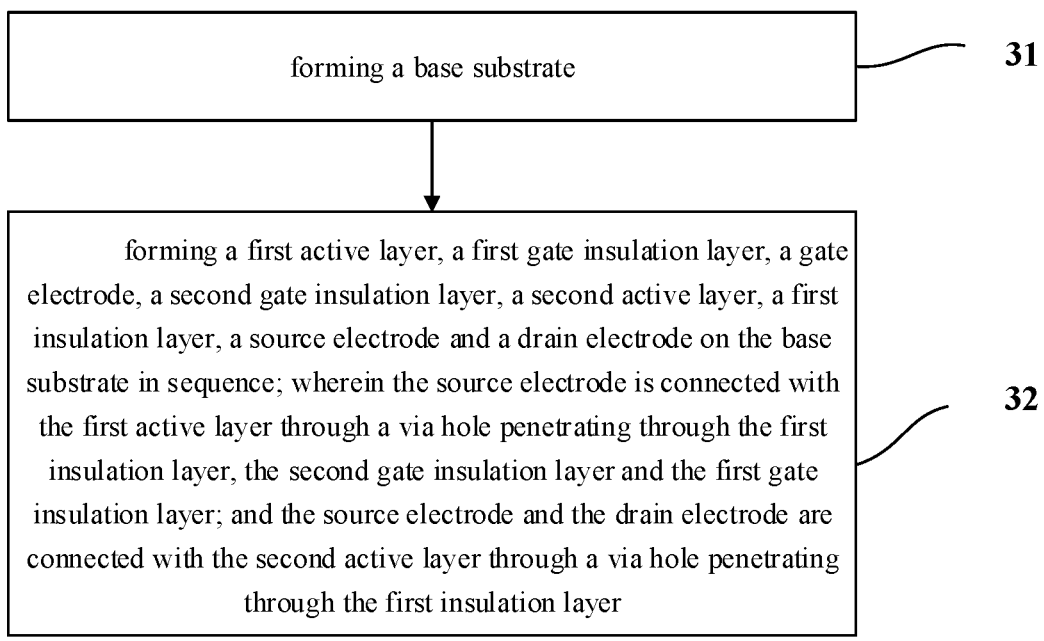
FIG. 3 is a flow chart of a manufacturing method of the display substrate according to one embodiment of the present disclosure.

As shown in FIG. 3, the present disclosure further provides in some embodiments a manufacturing method of the display substrate, which includes the following steps.

Step 31: forming a base substrate.

Step 32: forming a first active layer, a first gate insulation layer, a gate electrode, a second gate insulation layer, a second active layer, a first insulation layer, a source electrode and a drain electrode on the base substrate in sequence. The source electrode is connected with the first active layer through a via hole penetrating through the first insulation layer, the second gate insulation layer and the first gate insulation layer; and the source electrode and the drain electrode are connected with the second active layer through a via hole penetrating through the first insulation layer.

According to the embodiments of the present disclosure, the active layers with upper and lower laminated structures are provided, and the gate electrode and the gate insulation layer are arranged between the laminated active layers, so as to implement a TFT with the same effect as a TFT with the double gate structure. Without changing the pixel size and an aperture ratio, it is able to effectively reduce leakage current of the TFT and improve gray scale bright spots, flicker and other related defects, thereby to improve customer experience.

In a possible embodiment of the present disclosure, an orthographic projection of the second active layer onto the base substrate is arranged within a region of an orthographic projection of the first active layer onto the base substrate.

In a possible embodiment of the present disclosure, prior to forming the first active layer on the base substrate, the manufacturing method further includes:

Step 301 of forming a data line on the base substrate; and

Step 302 of forming a second insulation layer on the data line and forming a via hole in the second insulation layer. The first active layer is connected with the data line through a via hole penetrating through the second insulation layer. An orthographic projection of the first active layer onto the base substrate and an orthographic projection of the second active layer onto the base substrate are arranged within a region of an orthographic projection of the data line onto the base substrate.

In a possible embodiment of the present disclosure, after forming the source electrode and the drain electrode on the base substrate, the manufacturing method further includes the following steps.

Step 33: forming a third insulation layer and forming a via hole in the third insulation layer.

Step 34: forming a pixel electrode connected with the drain electrode through a via hole penetrating through the third insulation layer.

Step 35: forming a fourth insulation layer.

Step 36: forming a common electrode.

FIG. 4 to FIG. 14 show a manufacturing method of the display substrate in another embodiment of the present disclosure, and the method includes the following steps.

Figure 4:
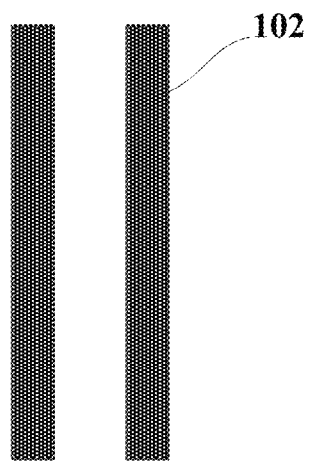
FIG. 4 to FIG. 14 are schematic views showing a manufacturing method of the display substrate according to another embodiment of the present disclosure.

Step 41: as shown in FIG. 4, forming a data line 102 on a base substrate (not shown).

Figure 5:
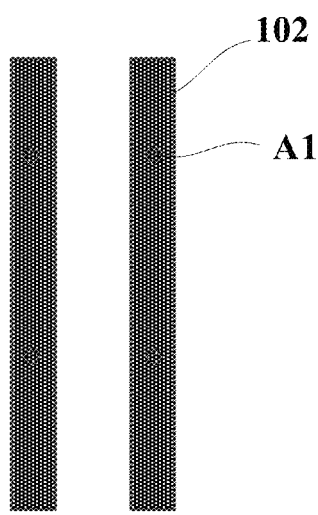

Step 42: as shown in FIG. 5, forming a second insulation layer (not shown) on the data line 102, and forming a via hole A1 in the second insulation layer.

Figure 6:
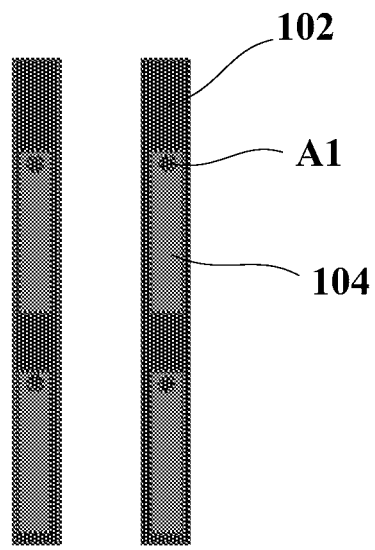

Step 43: as shown in FIG. 6, forming a first active layer 104 on the second insulation layer, and the first active layer 104 being connected with the data line 102 through the via hole A1.

Figure 7:
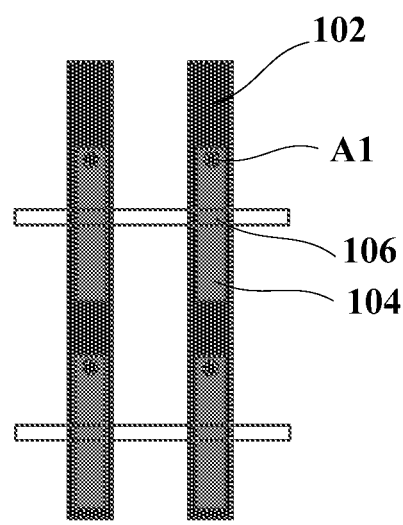

Step 44: as shown in FIG. 7, forming a first gate insulation layer (not shown) on the first active layer 104, forming a gate electrode 106 on the first gate insulation layer, and forming a gate line being simultaneously with the gate electrode 106.

Figure 8:
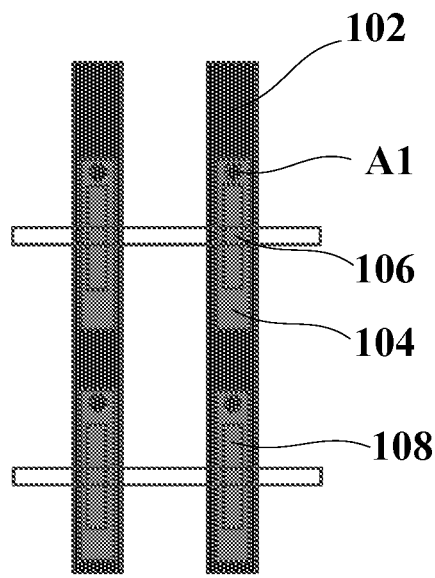

Step 45: as shown in FIG. 8, forming a second gate insulation layer (not shown) on the gate electrode 106, and forming a second active layer 108 on the second gate insulation layer.

Figure 9:
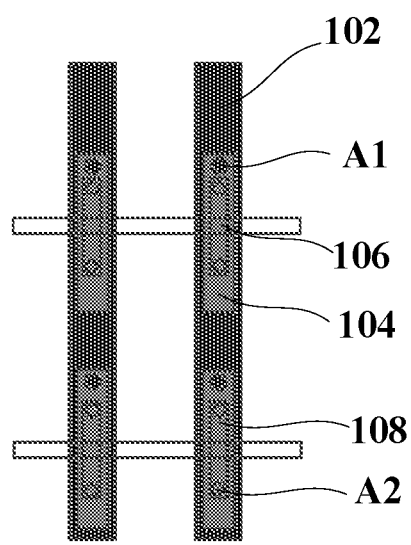

Step 46: as shown in FIG. 9, forming a first insulation layer (not shown) on the second active layer 108, and forming a via hole A2 in the first insulation layer.

Figure 10:
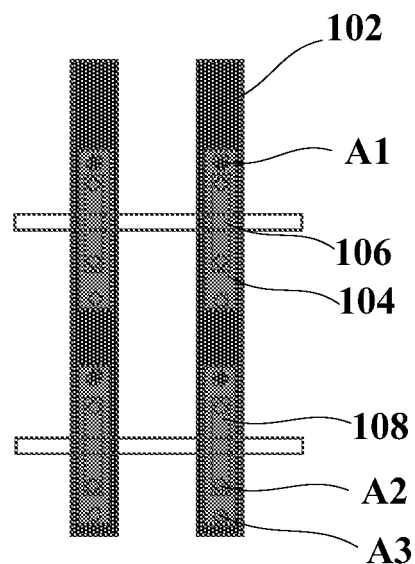

Step 47: as shown in FIG. 10, forming a via hole A3, the via hole A3 penetrating through the first insulation layer, the second gate insulation layer and the first gate insulation layer.

Figure 11:
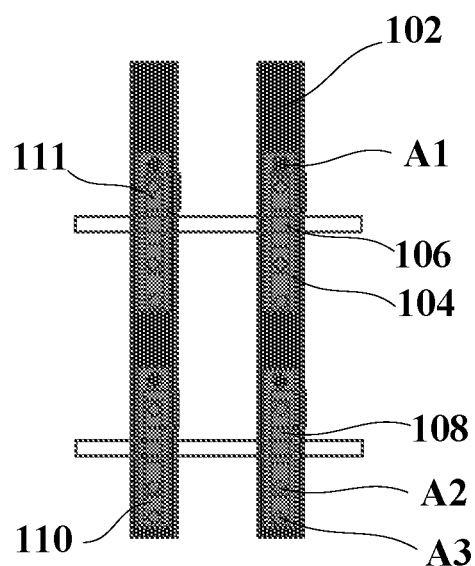

Step 48: as shown in FIG. 11, forming a source electrode 110 and a drain electrode 111, the source electrode 110 being connected with the second active layer 108 through the via hole A2, the drain electrode 111 being connected with the second active layer 108 through the via hole A2, and the source electrode 110 being connected with the first active layer 104 through the via hole A3.

Figure 12:
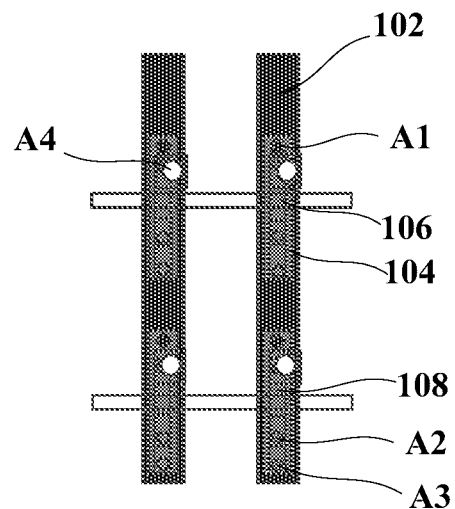

Step 49: as shown in FIG. 12, forming a third insulation layer (not shown), and forming a via hole A4 in the third insulation layer.

Figure 13:
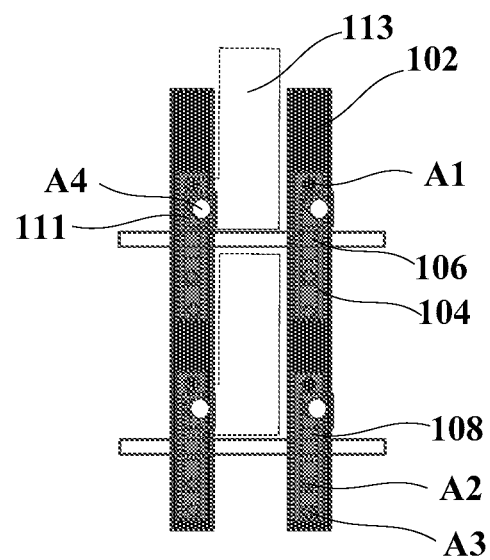

Step 410: as shown in FIG. 13, forming a pixel electrode 113, the pixel electrode 113 being connected with the drain electrode 111 through the via hole A4 penetrating through the third insulation layer.

Figure 14:
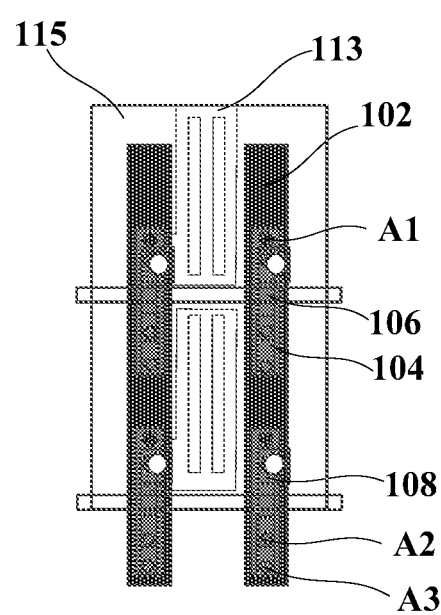

Step 411: as shown in FIG. 14, forming a fourth insulation layer (not shown), and forming a common electrode 115 on the fourth insulation layer.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate and a plurality of pixels arranged on the base substrate, wherein each pixel comprises a plurality of sub-pixels, and each sub-pixel comprises a first active layer, a first gate insulation layer, a gate electrode, a second gate insulation layer, a second active layer, a first insulation layer, a source electrode and a drain electrode laminated one on another; wherein the source electrode is connected with the first active layer through a via hole penetrating through the first insulation layer, the second gate insulation layer and the first gate insulation layer; and the source electrode and the drain electrode are connected with the second active layer through a via hole penetrating through the first insulation layer;

wherein the display substrate further comprises a data line and a second insulation layer, wherein the data line is arranged at a side of the base substrate close to the first active layer, the second insulation layer is arranged between the data line and the first active layer, and the first active layer is connected with the data line through a via hole penetrating through the second insulation layer.

2. The display substrate according to claim 1, wherein an orthographic projection of the second active layer onto the base substrate is arranged within a region of an orthographic projection of the first active layer onto the base substrate.

3. The display substrate according to claim 1, wherein an orthographic projection of the first active layer onto the base substrate and an orthographic projection of the second active layer onto the base substrate are arranged within a region of an orthographic projection of the data line onto the base substrate.

4. The display substrate according to claim 1, further comprising a third insulation layer, a pixel electrode, a fourth insulation layer and a common electrode, wherein the pixel electrode is connected with the drain electrode through a via hole penetrating through the third insulation layer, and the fourth insulation layer is arranged between the pixel electrode and the common electrode.

5. The display substrate according to claim 4, wherein the third insulation layer is a planarization layer for isolating the source electrode and the drain electrode.

6. The display substrate according to claim 4, wherein the fourth insulation layer is a passivation layer.

7. The display substrate according to claim 4, wherein the pixel electrode and the common electrode are used to form a pixel driving electric field.

8. The display substrate according to claim 7, wherein strip-shaped hollows are formed in the common electrode.

9. The display substrate according to claim 8, wherein the pixel electrode and the common electrode are made of the same transparent conductive material.

10. The display substrate according to claim 1, wherein a pixel density of the display substrate is greater than or equal to 1500 pixels per inch.

11. A display device, comprising the display substrate according to claim 1.

12. The display device according to claim 11, wherein the display device is an augmented reality display device or a virtual reality display device.

13. The display substrate according to claim 1, wherein the first gate insulation layer and the second gate insulation layer are made of the same insulation material or different materials.

14. The display substrate according to claim 1, wherein the materials of the second active layer and the first active layer are the same.

15. The display substrate according to claim 1, wherein the source electrode and the drain electrode are made of the same or different metal materials as the gate electrode.

16. The display substrate according to claim 1, wherein the materials of the second active layer and the first active layer are different.

17. A manufacturing method of a display substrate, comprising:
    forming a base substrate; and
    forming a first active layer, a first gate insulation layer, a gate electrode, a second gate insulation layer, a second active layer, a first insulation layer, a source electrode and a drain electrode on the base substrate in sequence;
    wherein the source electrode is connected with the first active layer through a via hole penetrating through the first insulation layer, the second gate insulation layer and the first gate insulation layer; and the source electrode and the drain electrode are connected with the second active layer through a via hole penetrating through the first insulation layer;
    wherein prior to forming the first active layer on the base substrate, the manufacturing method further comprises:
    forming a data line on the base substrate; and
    forming a second insulation layer on the data line and forming a via hole in the second insulation layer;
    wherein the first active layer is connected with the data line through a via hole penetrating through the second insulation layer, and an orthographic projection of the first active layer onto the base substrate and an orthographic projection of the second active layer onto the base substrate are arranged within a region of an orthographic projection of the data line onto the base substrate.

18. The manufacturing method according to claim 17, wherein an orthographic projection of the second active layer onto the base substrate is arranged within a region of an orthographic projection of the first active layer onto the base substrate.

19. The manufacturing method according to claim 17, wherein after forming the source electrode and the drain electrode on the base substrate, the manufacturing method further comprises:
    forming a third insulation layer and forming a via hole in the third insulation layer;
    forming a pixel electrode connected with the drain electrode through a via hole penetrating through the third insulation layer;
    forming a fourth insulation layer; and
    forming a common electrode.

* * * * *